(12) United States Patent
Lilic

(10) Patent No.: US 11,921,150 B2
(45) Date of Patent: Mar. 5, 2024

(54) ELECTRIC CIRCUIT ARRANGEMENT TO DETERMINE A LEVEL OF AN EXCESS BIAS VOLTAGE OF A SINGLE PHOTON AVALANCHE DIODE

(71) Applicant: ams International AG, Jona (CH)

(72) Inventor: Nenad Lilic, Jona (CH)

(73) Assignee: AMS INTERNATIONAL AG, Jona (CH)

( * ) Notice: Subject to any disclaimer, the term of this patent is extended or adjusted under 35 U.S.C. 154(b) by 407 days.

(21) Appl. No.: 17/295,381

(22) PCT Filed: Nov. 14, 2019

(86) PCT No.: PCT/EP2019/081343
§ 371 (c)(1),
(2) Date: May 19, 2021

(87) PCT Pub. No.: WO2020/104291
PCT Pub. Date: May 28, 2020

(65) Prior Publication Data
US 2022/0003806 A1    Jan. 6, 2022

(30) Foreign Application Priority Data
Nov. 21, 2018    (EP) .................................... 18207598

(51) Int. Cl.
*H01L 31/07*    (2012.01)
*G01J 1/44*    (2006.01)
(Continued)

(52) U.S. Cl.
CPC ............ *G01R 31/2635* (2013.01); *G01J 1/44* (2013.01); *H03K 21/08* (2013.01); *G01J 2001/442* (2013.01); *G01J 2001/4466* (2013.01)

(58) Field of Classification Search
CPC ........ G01R 31/2635; G01J 1/44; H03K 21/08
See application file for complete search history.

(56) References Cited

U.S. PATENT DOCUMENTS

| 5,929,982 A | 7/1999 | Anderson |
| 5,933,042 A | 8/1999 | Trottier et al. |
| | (Continued) | |

FOREIGN PATENT DOCUMENTS

| CN | 102538988 A | 7/2012 |
| CN | 103148950 A | 6/2013 |
| | (Continued) | |

OTHER PUBLICATIONS

Chang et al., "Constant Excess Bias Control for Single-Photon Avalanche Diode Using Real-Time Breakdown Monitoring", IEEE Electron Device Letters, Aug. 2015, vol. 36, No. 8, pp. 859-861.
(Continued)

*Primary Examiner* — Alesa Allgood
(74) *Attorney, Agent, or Firm* — MH2 TECHNOLOGY LAW GROUP LLP

(57) ABSTRACT

An electric circuit arrangement to determine a level of an excess bias voltage of a single photon avalanche diode comprises an evaluation circuit being configured to determine a level of an excess bias voltage of the single photon avalanche diode in dependence on a signal course of an output signal of the single photon avalanche diode. In a first operational cycle of the circuit arrangement a voltage jump to the level of the excess bias voltage is generated at an output terminal, when a photon hits a photosensitive area of the single photon avalanche diode. In a subsequent second operational cycle, the output terminal of the single photon avalanche diode is coupled to a supply terminal.

13 Claims, 8 Drawing Sheets

(51) Int. Cl.
*G01R 31/26* (2020.01)
*H03K 21/08* (2006.01)

(56) References Cited

U.S. PATENT DOCUMENTS

| | | | |
|---|---|---|---|
| 9,823,123 B2* | 11/2017 | Tsai | G01J 1/44 |
| 10,158,038 B1* | 12/2018 | Do Valle | H01L 31/022408 |
| 2008/0231339 A1 | 9/2008 | Deschamps | |
| 2013/0334411 A1 | 12/2013 | Brunel et al. | |
| 2016/0223397 A1* | 8/2016 | Tsai | G01J 1/44 |
| 2017/0176579 A1* | 6/2017 | Niclass | G01S 17/10 |
| 2018/0120152 A1 | 5/2018 | Leonardo | |

FOREIGN PATENT DOCUMENTS

| | | |
|---|---|---|
| CN | 206294139 U | 6/2017 |
| CN | 106940221 A | 7/2017 |
| CN | 107063452 A | 8/2017 |
| EP | 1132724 A2 | 9/2001 |
| EP | 1132725 A2 | 9/2001 |
| EP | 3081963 A1 | 10/2016 |
| EP | 3419168 A1 | 12/2018 |
| JP | 2006179587 A | 7/2006 |
| JP | 102538988 A | 11/2018 |
| WO | 2016166002 A1 | 10/2016 |

OTHER PUBLICATIONS

International Search Report and Written Opinion dated Feb. 6, 2020 for corresponding International Application No. PCT/EP2019/081343 (Examiner, Unknown), 11 pages.
Qun, Yao, "Design of Quenching Circuit for Geiger Mode Avalanche Photodiode" (with English Abstract), School of Intergrated Circuits, Southeast University, May 2016, 87 pages.
Zheng, Hao et al., "High Sensitivity and Wide Dynamic Range Analog Front-End Circuits for Pulsed TOF 4-D Imaging ADAR Receiver", IEEE Sensors Journal, vol. 18, No. 8, Apr. 15, 2018, 11 pages.
Zhou, Xiaoya, "Toward 3D imaging single photon Avalanche Diode and Pixel Circuit" (with English Abstract), Kiangtan University, May 2013, 73 pages.
Liu, Qingqing, Chinese First Office Action (with English Translation) in Chinese Application No. 201980075469.2 dated Jun. 14, 2022, 15 pages.

* cited by examiner

ELECTRIC CIRCUIT ARRANGEMENT TO DETERMINE A LEVEL OF AN EXCESS BIAS VOLTAGE OF A SINGLE PHOTON AVALANCHE DIODE

CROSS-REFERENCE TO RELATED APPLICATIONS

The present application is the national stage entry of International Patent Application No. PCT/EP2019/081343, filed on Nov. 14, 2019, and published as WO 2020/104291 A1 on May 28, 2020, which claims the benefit of priority of European Patent Application No. 18207598.6, filed on Nov. 21, 2018, all of which are incorporated by reference herein in their entirety.

TECHNICAL FIELD

The disclosure relates to an electric circuit arrangement to determine a level of an excess bias voltage of a single photon avalanche diode.

BACKGROUND

A single photon avalanche diode (SPAD) is a highly sensitive optical device mainly used to detect a moment when a photon hits an optical sensor of the avalanche diode. When the SPAD is reverse biased with a bias voltage VHV higher than a breakdown voltage VBD, an electron hole pair is generated, when a photon hits the SPAD. Due to the high electrical field, the SPAD generates a very short high peak current pulse.

The breakdown voltage is an intrinsic parameter of the SPAD. The performance of the SPAD depends on how much the bias voltage VHV is higher than the breakdown voltage VBD. The bias voltage VHV of the SPAD can be expressed as VHV=VBD−Vex, where Vex is the excess bias voltage. Since the breakdown voltage VBD is a function of temperature, the excess bias voltage Vex will also change in response to a temperature change, if it is assumed that the (reverse) bias voltage VHV is kept constant.

On the other hand, if the excess bias voltage Vex changes, the physical parameters of the SPAD, for example the DCR (Dark Count Rate) or PDP (Photon Detection Probability), of the SPAD will also change. Therefore, if the bias voltage VHV would not be adapted in response to temperature changes, the breakdown voltage VBD and thus the excess bias voltage Vex as well as the physical parameters of the SPAD would also change, resulting in a systematic timing jitter, when the SPAD is used in an application of distance measurement, for example a time-of-flight application.

There is desire to provide an electric circuit arrangement to determine a level of an excess bias voltage of a single photon avalanche diode to adjust the bias voltage of the single photon avalanche diode so that the physical parameters of the single photon avalanche diode are nearly unaffected by environmental influences, for example temperature changes.

SUMMARY

An embodiment of an electric circuit arrangement to determine a level of an excess bias voltage of a single photon avalanche diode within a short time and nevertheless with high precision is specified in claim 1.

According to an embodiment of the electric circuit arrangement to determine a level of an excess bias voltage of a single photon avalanche diode, the electric circuit arrangement comprises a supply terminal to apply a supply potential, a reference terminal to apply a reference potential, and a bias terminal to apply a bias potential to bias the single photon avalanche diode, and an output terminal to provide an output signal of the single photon avalanche diode. The single photon avalanche diode is connected between the bias terminal and the output terminal.

The electric circuit arrangement comprises a controllable switching circuit and an evaluation circuit to evaluate the output signal. The controllable switching circuit is configured to couple the output terminal to the reference terminal in a first operational cycle of the circuit arrangement so that a voltage jump to the level of the excess bias voltage occurs at the output terminal, when a photon hits a photosensitive area of the single photon avalanche diode. The controllable switching circuit is further configured to couple the output terminal to the supply terminal in a subsequent second operational cycle. The evaluation circuit is configured to determine the level of the excess bias voltage in dependence on a signal course of the output signal.

The proposed solution enables the current level of the excess bias voltage to be found with a first detected photon event. For this purpose, the output terminal is coupled to the reference terminal to apply the reference potential, for example a ground potential, during the first operational cycle of the electric circuit arrangement. If a photon hits the photosensitive area of the single photon avalanche diode, the output signal at the output terminal shows a voltage jump/peak to the level of the excess bias voltage to be determined.

After the occurrence of the voltage jump/peak at the output terminal, the controllable switching circuit operates the electric circuit arrangement in the second operational cycle, in which the output terminal is coupled to the bias terminal to apply the bias potential so that the output terminal is charged. During the charging of the output terminal, the single photon avalanche diode stays quenched so that the SPAD does not conduct any current and no other photons can trigger the SPAD during the charging process. As a result, the output signal at the output terminal shows a linear increasing slope from the level of the excess bias voltage to be determined to the level of the supply potential.

The linear increasing voltage slope of the output signal after the occurrence of the voltage jump/peak at the output terminal allows to determine the level of the excess bias voltage in a simple but precise manner. In particular, the level of the excess bias voltage is determined in dependence from a first time between the occurrence of the voltage jump/peak to the level of the excess bias voltage and the crossing of a first threshold value of the output signal at the output terminal, and in dependence from a second time between the crossing of the first threshold value of the output signal and the crossing of a second threshold value of the output signal.

A first timespan between the occurrence of the voltage jump/peak to the level of the excess bias voltage at the output terminal and the crossing of the first threshold value of the output signal, and a second timespan between the voltage jump/peak to the level of the excess bias voltage and the crossing of the second threshold value of the output signal can be determined in the digital domain by using a time-to-digital converter or a digital counter. The use of a time-to-digital converter (TDC) or a digital counter as a component of the evaluation circuit enables to calculate the level of the excess bias voltage in the digital domain.

Thus, a dedicated reference circuit for different excess bias voltages is not needed. Moreover, the proposed solution of the electric circuit arrangement to determine the level of the excess bias voltage is expected to be small in area and to have low power consumption. Furthermore, the time necessary to find the appropriate level of the excess bias voltage is expected to be small, because only one event of an impact of a photon onto the photosensitive area of the SPAD is needed to find the current level of the excess bias voltage.

The accompanying drawings are included to provide a further understanding and are incorporated in and constitute a part of this specification. The drawings illustrate several embodiments of the electric circuit arrangement to determine a level of the excess bias voltage of a single photon avalanche diode, and together with the description serve to explain principles and the operation of the various embodiments of the electric circuit arrangement.

DETAILED DESCRIPTION

Figure 1:
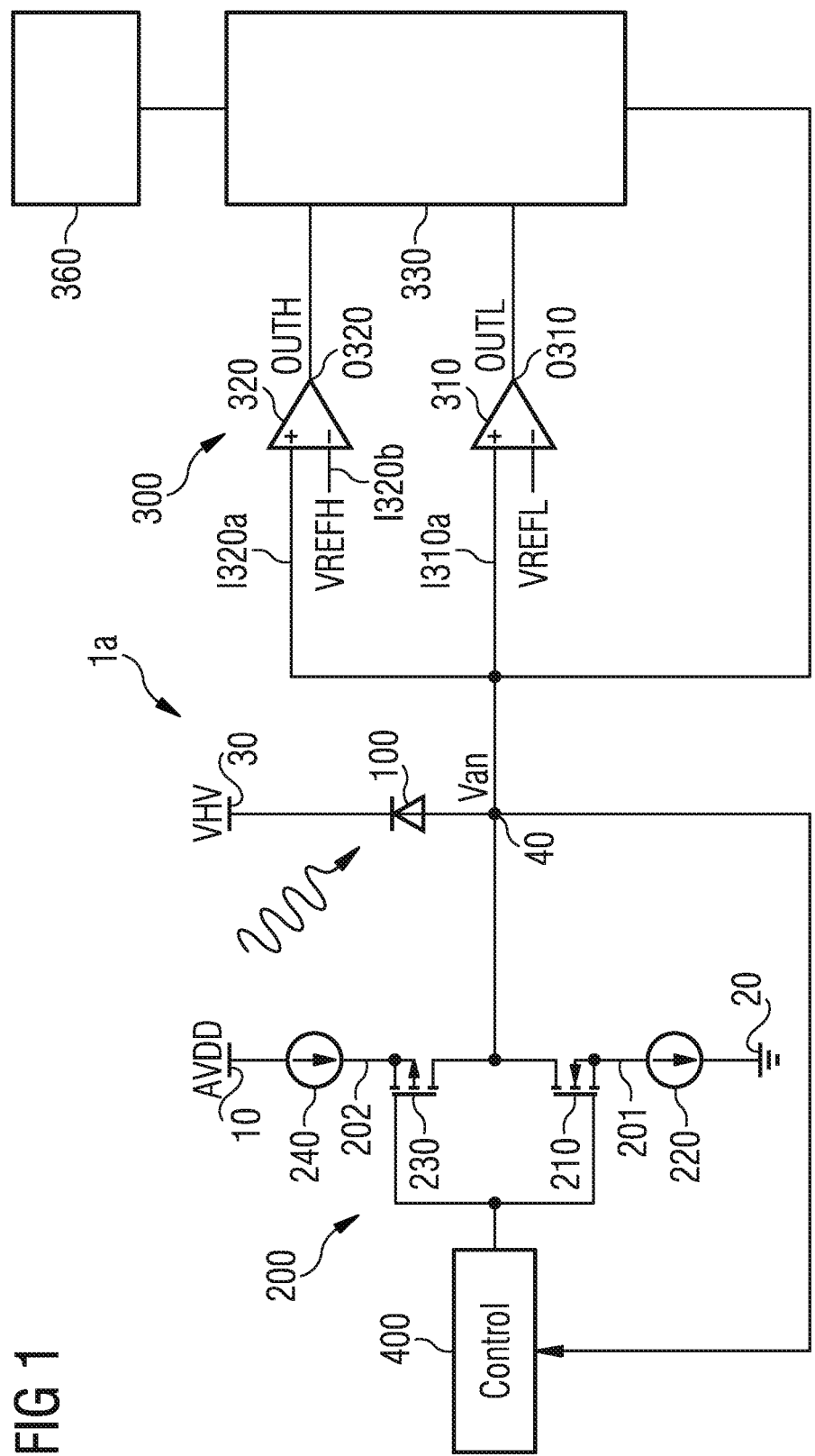
FIG. 1 shows a first embodiment of an electric circuit arrangement to determine a level of an excess bias voltage of a SPAD.
Figure 5:
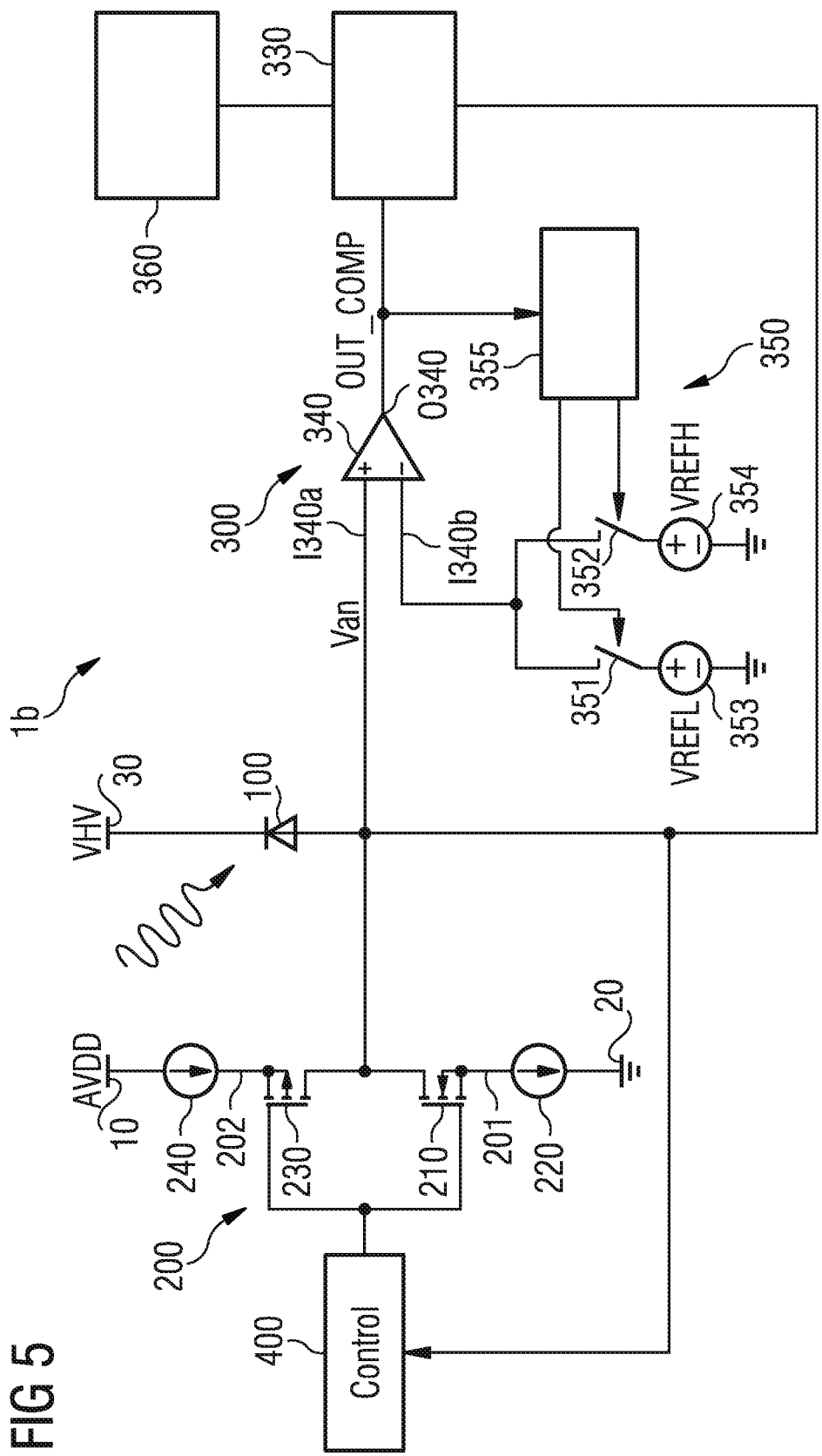
FIG. 5 illustrates a second embodiment of an electric circuit arrangement to determine a level of an excess bias voltage of a SPAD.

FIG. 1 shows a first embodiment of an electric circuit arrangement 1a to determine a level of an excess bias voltage Vex of a single photon avalanche diode. A second embodiment of an electric circuit arrangement 1b to determine a level of an excess bias voltage of a single photon avalanche diode is shown in FIG. 5. In the following, the common elements of the first and second embodiment of the electric circuit arrangement 1a and 1b to determine a level of an excess bias voltage of a single photon avalanche diode are described.

The electric circuit arrangement 1a, 1b comprises a supply terminal 10 to apply a supply potential AVDD and a reference terminal 20 to apply a reference potential GND, for example a ground potential. The supply potential AVDD may be generated by a main battery of the electric circuit arrangement or may be any other voltage generated, for example, by a voltage doubler, a charge pump, a DC-DC converter, etc. The electric circuit arrangement 1a, 1b further comprises a bias terminal 30 to apply a bias potential VHV to bias a single photon avalanche diode 100. The electric circuit arrangement 1a, 1b comprises an output terminal 40 to provide an output signal Van of the single photon avalanche diode 100. The single photon avalanche diode 100 is connected between the bias terminal 30 and the output terminal 40.

The electric circuit arrangement 1a, 1b comprises a controllable switching circuit 200. The controllable switching circuit 200 is configured to electrically couple the output terminal 40 to the reference terminal 20 in a first operational cycle of the circuit arrangement 1a, 1b so that a voltage jump to the level of the excess bias voltage Vex occurs at the output terminal 40, when a photon hits a photosensitive area of the single photon avalanche diode 100. The controllable switching circuit 200 is further configured to electrically couple the output terminal 40 to the supply terminal to apply the supply potential AVDD in a subsequent second operational cycle of the circuit arrangement 1a, 1b.

The electric circuit arrangement 1a, 1b further comprises an evaluation circuit 300 to evaluate the output signal Van. The evaluation circuit 300 is configured to determine the level of the excess bias voltage Vex in dependence on a signal course of the output signal Van. For this purpose, the evaluation circuit 300 monitors the signal course of the output signal Van at the output terminal 40.

The single photon avalanche diode 100 of the electric circuit arrangement 1a, 1a is quenched, i.e. operated in a non-conductive state, when the voltage jump/peak of the output signal Van to the level of the excess bias voltage Vex is generated at the output terminal 40. As a consequence, the level of the output signal Van rises with a linear increasing slope. This configuration advantageously enables that the evaluation circuit 300 has to evaluate a voltage course of the output signal with a linear gradient to determine the level of the excess bias voltage Vex. The level of the excess bias voltage can be determined by elementary mathematical functions as explained later so that the evaluation circuit can be implemented with reduced complexity.

According to the electric circuit arrangement 1a, 1b, a control circuit 400 is provided to control the controllable switching circuit 200. The control circuit 400 is configured to control the controllable switching circuit 200 in dependence on a value of the output signal Van at the output terminal 40. As an advantageous consequence, a reference circuit for evaluating different Vex bias voltages is not needed.

The controllable switching circuit 200 is configured to selectively electrically couple the output terminal 40 to the supply terminal 10 or the reference terminal 20 in dependence on the value of the output signal Van at the output terminal 40. This configuration of the controllable switching circuit 200 allows to provide a voltage jump/peak of the output signal Van at the output terminal 40, when a photon hits the photosensitive area of the single photon avalanche diode 100 for the first time and the controllable switching circuit 200 electrically couples the output terminal 40 to the reference potential at the reference terminal 20.

The control circuit 400 is configured to control the controllable switching circuit 200 so that the output terminal 40 is electrically coupled by the controllable switching circuit 200 to the supply terminal 10, when the output terminal 40 is previously electrically coupled to the reference terminal 20 and the control circuit 40 detects the occurrence of the voltage jump/peak of the output signal Van at the output terminal 40. This configuration of the control circuit 400 or the controllable switching circuit 200 enables that the voltage at the output terminal 40 continuously increases during the second operational cycle, when a photon has hit the photosensitive area of the single photon avalanche diode 100 for the first time and the single photon avalanche diode is quenched. Thus, the output signal Van at the output terminal 40 shows a linear increasing voltage slope during the second operational cycle.

According to the embodiment of the electric circuit arrangement 1a, 1b, the controllable switching circuit 200 comprises a first current path 201 being arranged between the output terminal 40 and the reference terminal 20, and a second current path 202 being arranged between the output terminal 40 and the supply terminal 10. The first current path 201 comprises a first controllable switch 210 and a first current generator 220. The second current path 202 comprises a second controllable switch 230 and a second current generator 240.

According to the embodiment of the electric circuit arrangement 1a and 1b, the controllable switching circuit 200 comprises a quenching circuit which is realized by the first controllable switch 210 and the first current source 220.

This configuration of the controllable switching circuit 200 advantageously enables that a voltage jump/peak of the output signal Van occurs at the output terminal 40, when a photon hits the photosensitive area of the single photon avalanche diode 100 for the first time, and the output terminal 40 is connected to the reference terminal 20 via the first current path 201, i.e. via the first controllable switch 210 and the first current generator 220. Furthermore, the configuration of the controllable switching circuit 200 enables that the output signal Van rises at the output terminal 40 from the level of the excess bias voltage Vex to a value of the supply voltage AVDD with a linear increasing slope, when the output terminal 40 is electrically coupled to the supply terminal 10 via the second current path 202, i.e. via the second controllable switch 230 and the second current generator 240.

According to the embodiments of the electric circuit arrangement 1a and 1b, the first controllable switch 210 and the first current generator 220 are connected in series in the current path 201 between the output terminal 40 and the reference terminal 20. The controllable switch 230 and the current generator 240 are connected in series in the current path 202 between the output terminal 40 and the supply terminal 10.

The control circuit 400 is arranged in a feedback path between the output terminal 40 and the controllable switching circuit 200. In particular, the control circuit 400 generates a control signal to control the controllable switches 210 and 230 in an opposed way. If the controllable switch 210 is switched in a conductive state, the controllable switch 230 is operated in a non-conductive state and vice versa.

The first embodiment of the electric circuit arrangement 1a is described in the following with reference to FIGS. 1 to 4.

According to the embodiment of the electric circuit arrangement 1a, the evaluation circuit 300 comprises a comparator circuit 310 having a first input terminal I310a coupled to the output terminal 40, and a second input terminal I310b to apply a first threshold value VREFL. The comparator circuit 310 further comprises a first comparator output terminal O310 to output a first comparison signal OUTL. The first comparator circuit 310 advantageously enables to detect the instant of time when the level of the output signal Van reaches the first threshold value VREFL.

The evaluation circuit 300 further comprises a second comparator circuit 320 having a first input terminal I320a coupled to the output terminal 40, and a second input terminal I320b to apply a second threshold value VREFH. The second comparator circuit 320 further comprises a second comparator output terminal O320 to output a second comparison signal OUTH. The second comparator circuit 320 advantageously enables to detect the instant of time when the output signal Van reaches the second threshold value VREFH.

The electric circuit arrangement 1a comprises a time-to-digital converter or a digital counter 330 being coupled to the first and second comparator output terminal O310, O320 and to the output terminal 40. The time-to-digital converter/digital counter 330 advantageously enables to execute the calculation of the level of the excess bias voltage Vex in the digital domain.

As shown in FIG. 1, the evaluation circuit 300 of the electric circuit arrangement 1a comprises a calculation circuit 360 being coupled to the time-to-digital converter/digital counter 330. The calculation circuit 360 may be configured as a microprocessor to calculate the level of the excess bias voltage Vex in response to an output signal of the time-to-digital converter/digital counter 330.

Figure 2:
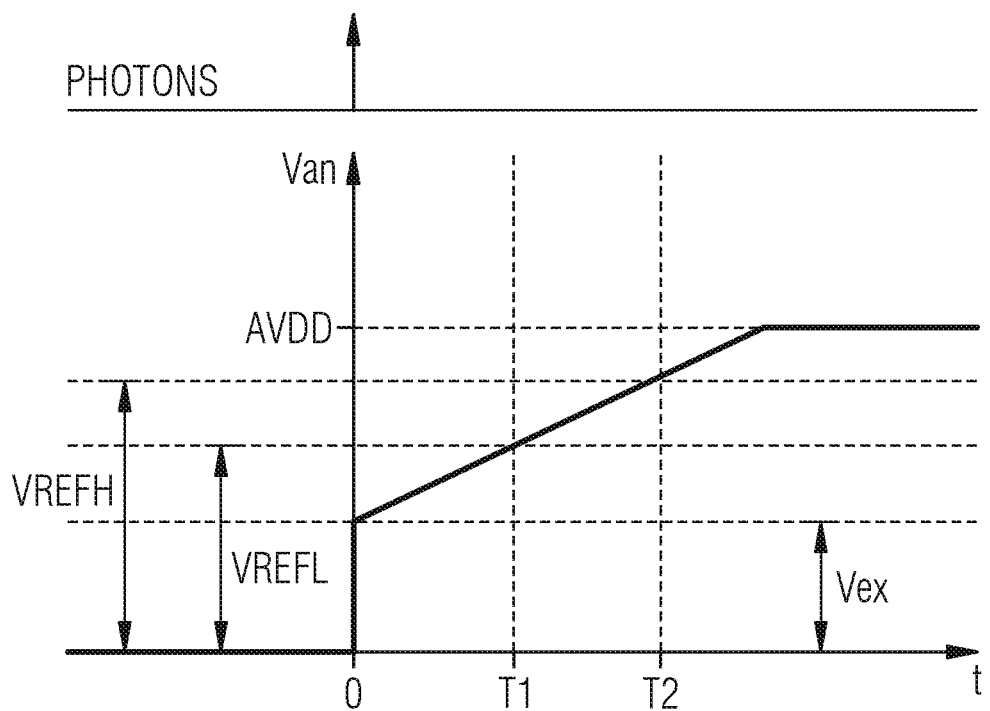
FIG. 2 shows a voltage slope of an output signal of the SPAD being used to determine a level of an excess bias voltage of the SPAD.

FIG. 2 illustrates the measurement/calculation principle of the electric circuit arrangement 1a to determine the level of the excess bias voltage Vex of the single photon avalanche diode 100. The approach is based on the calculation of the level of the excess bias voltage Vex from the voltage slope of the output signal Van.

As explained above, in the first operational cycle of the circuit arrangement 1a, the output terminal 40 is electrically coupled to the reference terminal 20 by the controllable switching circuit 200. In particular, the control circuit 400 controls the controllable switching circuit 200 such that the first controllable switch 210 is operated in a conductive state and the second controllable switch 230 is operated in a non-conductive state. As a result, the level of the output signal Van is at a level of the reference potential, for example the ground potential GND.

If a photon hits the single photon avalanche diode 100, the voltage level of the output signal Van rises up to the level of the excess bias voltage Vex. A voltage jump/peak of the output signal Van to the level of the excess bias voltage Vex occurs at the output terminal 40. After the firing of the SPAD, i.e. the operation of the SPAD in the conductive state, the control circuit 400 in the feedback loop is activated to operate the first controllable switch 210 in a non-conductive state and to operate the second controllable switch 230 in a conductive state. The second current source 240 starts to charge the output terminal 40 so that the output signal Van rises at the output terminal 40 from the level of the excess bias voltage Vex to a value of the supply voltage AVDD.

During the charging process, the single photon avalanche diode 100 stays quenched, i.e. the SPAD 100 is operated in the non-conductive state, because by charging the output terminal 40/anode node of the SPAD 100 from the level of the excess bias voltage Vex up to the level of the supply voltage AVDD, the voltage at the SPAD, which means the voltage between the cathode and the anode of the SPAD, rolls off below breakdown voltage VBD up to VBD-(AVDD-Vex). This means that other photons cannot trigger the SPAD 100 during the charging process.

If the voltage values of the output signal Van are known at certain time points of the slope of the output signal Van, the level of the excess bias voltage Vex can be calculated. The capacitance of the output terminal 40/anode node of the SPAD 100 or the amount of constant current is not an issue for this solution.

The evaluation circuit 300 is configured to determine a first time T1 during which the output signal Van rises at the output terminal 40 from the level of the excess bias voltage Vex to the first threshold value VREFL. Furthermore, the evaluation circuit 300 is configured to determine a second time T2 during which the output signal Van rises at the output terminal 40 from the first threshold value VREFL to a second threshold value VREFH. This configuration of the evaluation circuit advantageously allows to calculate the level of the excess bias voltage Vex from the voltage slope of the output signal Van shown in FIG. 2 according to the formula $$Vex = VREFL - \frac{T1}{T2}(VREFL - VREFH)$$

The instant of times when the voltage slope of the output signal Van crosses the first threshold value VREFL and the second threshold value VREFH can be detected with the first comparator circuit 310 and the second comparator circuit 320. However, the comparator circuits 310, 320 introduce offset times from the input to the output, due to offset voltage and internal parasitic nodes of the comparator circuits. Because of these offset times, the formula should be changed to $$Vex = VREFL - \frac{T1 + T_{offset\_low}}{T2 + T_{offset\_high}}(VREFL - VREFH)$$

The offset time $T_{offset\_low}$ is the offset time of the first comparator circuit 310, and the offset time $T_{offset\_high}$ is the offset time of the second comparator circuit 320. The offset times can be both positive or negative, meaning that the first and second comparator circuit can change their state sometime before or sometime after the voltage slope of the output signal Van crosses the first and second threshold values VREFL, VREFH. If T1 is very large against $T_{offset\_low}$ (T1>>|$T_{offset\_low}$|), and T2 is very large against $T_{offset\_high}$ (T2>>|$T_{offset\_high}$|), the measurement is less affected by comparator offsets and internal parasitics.

Figure 3:
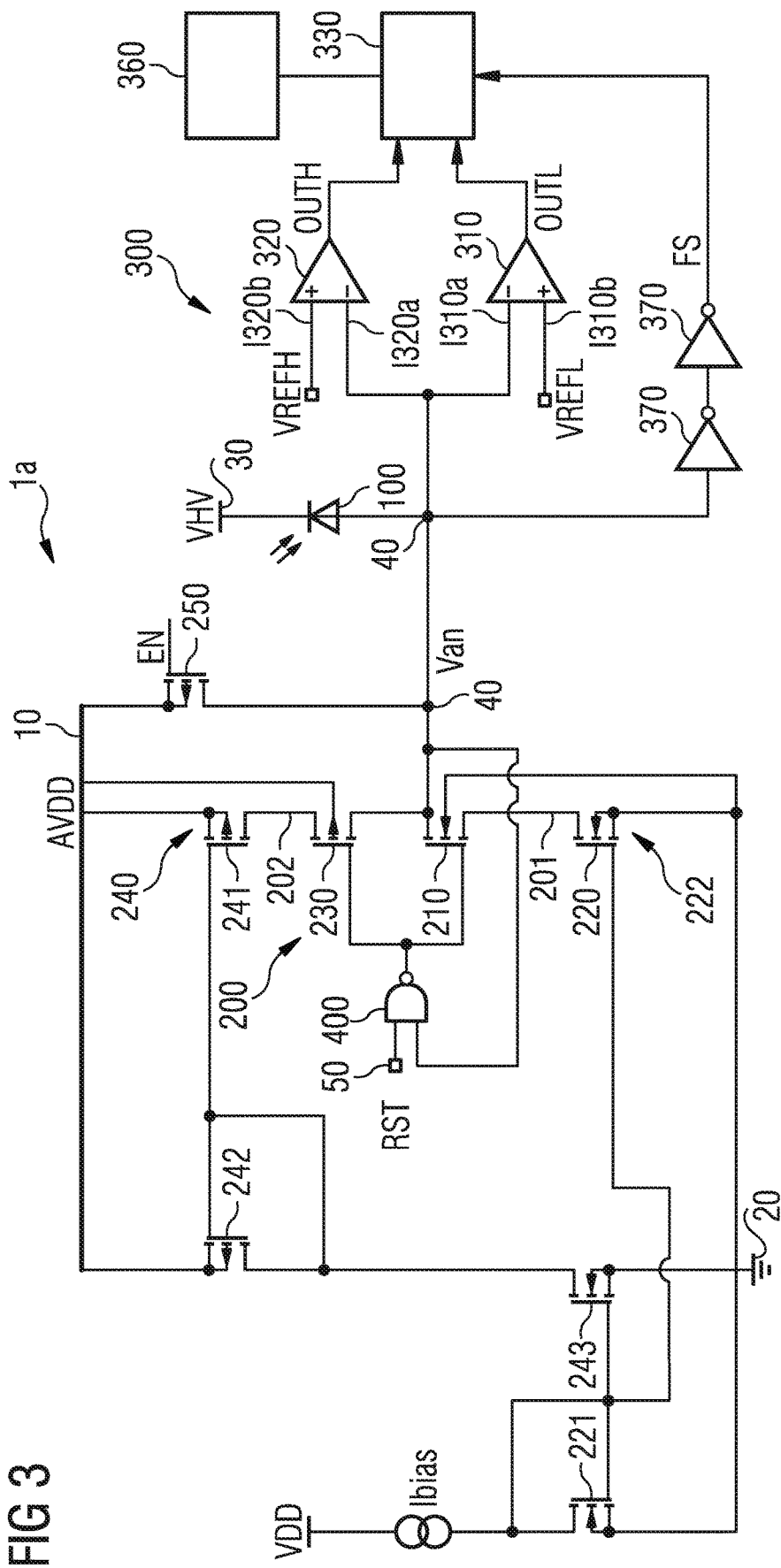
FIG. 3 shows a possible implementation of the first embodiment of the electric circuit arrangement to determine a level of the excess bias voltage of the SPAD.

FIG. 3 shows a possible implementation to realize the electric circuit arrangement 1a of FIG. 1 to determine the level of the excess bias voltage Vex of the single photon avalanche diode 100. The electric circuit arrangement 1a comprises the single photon avalanche diode 100, the controllable switching circuit 200, the evaluation circuit 300 and the controller 400. The single photon avalanche diode 100 is arranged between the bias terminal 30 to apply the bias potential VHV and the output terminal 40 to provide the output signal Van.

The controllable switching circuit 200 comprises the first controllable switch 210, the first current generator 220 and the second controllable switch 230, the second current generator 240. The first current generator 230 is realized by a current mirror comprising transistors 221 and 222. The current mirror is coupled to a constant current source 260 to provide the constant current Ibias. The second current generator 240 is realized by a first current mirror including transistors 221 and 243 and a second current mirror including transistors 241 and 242. Furthermore, a controllable switch 250 is provided to enable/activate the electric circuit arrangement 1a to determine the level of the excess bias voltage Vex.

The evaluation circuit 300 comprises the first comparator circuit 310 and the second comparator circuit 320, the time-to-digital converter/digital counter 330 and the calculation circuit 360. The evaluation circuit 300 further comprises in-series connected inverters 370 to electrically couple the time-to-digital converter/digital counter 330 to the output terminal 40.

The control circuit 400 is coupled with its input side to the output terminal 40 and to a reset terminal 50 to apply a reset signal RST. The control circuit 400 may be embodied as a NAND gate 401 having the reset terminal 50. Another input terminal of the NAND gate 401 is coupled to the output terminal 40.

Figure 4:
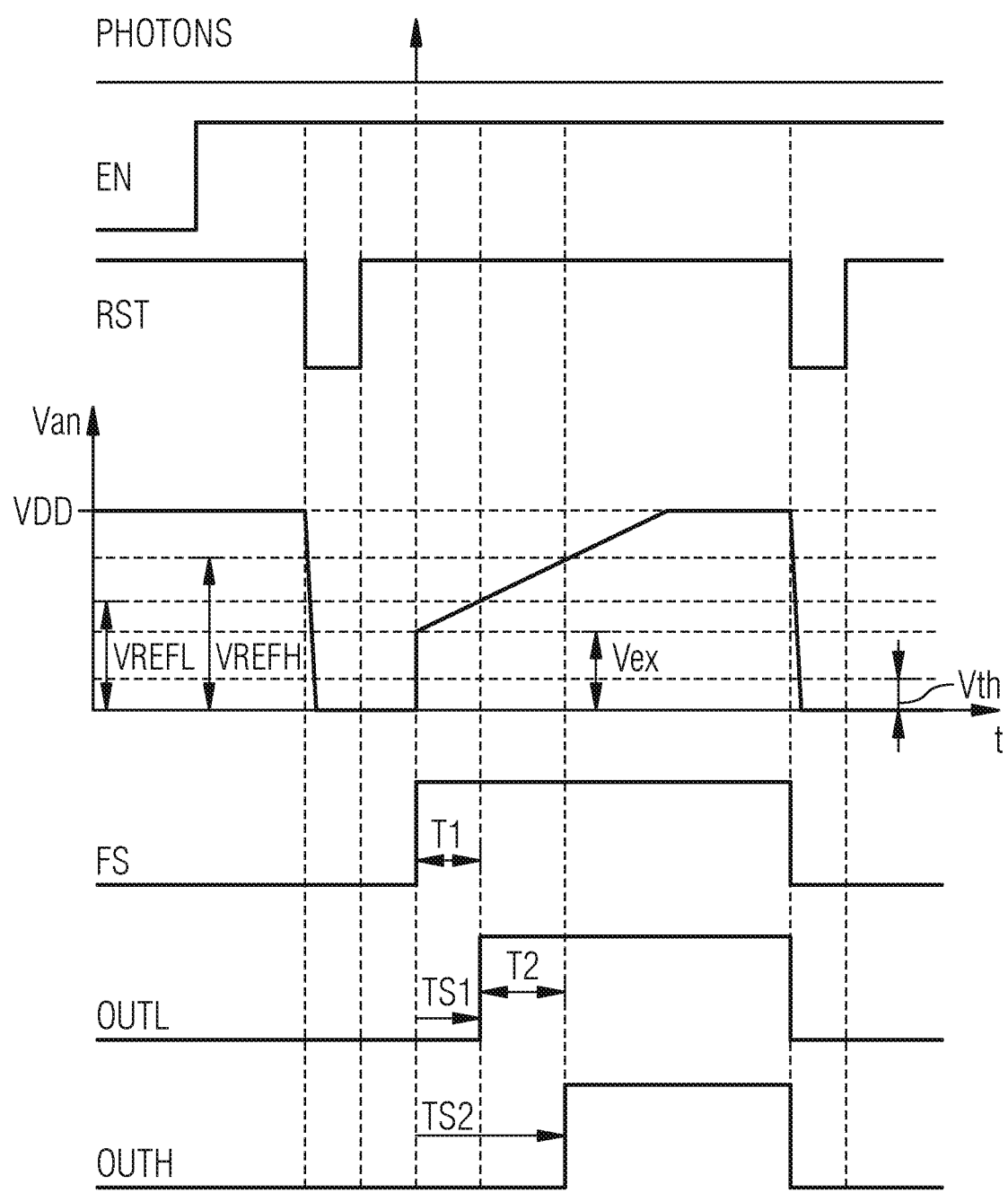
FIG. 4 illustrates a time diagram of signals at internal nodes of the implementation of the first embodiment of the electric circuit arrangement to determine a level of the excess bias voltage of the SPAD.

The functioning of the electric circuit arrangement 1a of FIG. 3 is explained in the following with reference to the time diagram shown in FIG. 4. When the control signal EN to enable/activate the electric circuit arrangement 1a is low, the output terminal 40 is connected to the supply terminal 10 via the controllable switch 250 which is operated in a conductive state. As a consequence, the single photon avalanche diode 100 is quenched, i.e. operated in a non-conductive state. If the electric circuit arrangement 1a is activated/enabled to determine the level of the excess bias voltage Vex of the single photon avalanche diode 100 the control signal EN and the reset signal RST are set to a high level. As a result, the controllable switch 230 is operated in the conductive state and the controllable switch 210 is operated in the non-conductive state. The output terminal 40 stays connected to the supply potential AVDD via the controllable switch 230 and transistor 241.

The control circuit 200 is configured to electrically couple the output terminal 40 to the reference terminal 20, when the control circuit 400 detects a pulse of the reset signal RST applied to the reset terminal 50. Thus, when the reset signal RST changes from the high state to a low state (reset phase), the first controllable switch 210 is switched in the conductive state and the second controllable switch 230 is switched in the non-conductive state. As a result, the output terminal 40 is discharged to ground via current regulated quenching transistor 222.

When a photon hits the SPAD 100, the potential of the output signal Van at the output terminal 40 rises up to the level of the excess bias voltage Vex. As shown in the time diagram of FIG. 2, a voltage jump/peak of the output signal Van to the level of the excess bias voltage Vex occurs at the output terminal 40. At this moment, the SPAD 100 is quenched. If the potential of the output signal Van at the output terminal 40 is higher than a threshold voltage Vth inside one of the inverters 370 and the NAND gate 401 of the control circuit 400, a feedback signal FS generated at the output side of the in-series coupled inverters 370 becomes high and the NAND gate 401 switches the controllable switch 210 in the non-conductive state and the second controllable switch 230 in the conductive state.

As a result, the current path 202 with the transistor 241 starts to charge the output terminal 40 up to the supply potential AVDD. The output signal Van rises at the output terminal 40 from the level of the excess bias voltage Vex to a value of the supply voltage AVDD. The rising voltage shows a linear increasing course. In particular, the voltage slope of the output signal Van shows a linear gradient.

During this charging process the potential of the output signal at the output terminal 40 crosses the first threshold value VREFL and the second threshold value VREFH. The evaluation circuit 300 determines the first time T1 during which the output signal Van rises at the output terminal 40 from the level of the excess bias voltage Vex to the first threshold value VREFL. Furthermore, the evaluation circuit 300 determines the second time T2 during which the output signal Van rises at the output terminal 40 from the first threshold value VREFL to the second threshold value VREFH.

For this purpose, the first comparator circuit 310 is configured to output a pulse, for example a rising edge from the low to the high state, of the first comparison signal OUTL, when the output signal Van exceeds the first threshold value VREFL. Furthermore, the second comparator circuit 320 is configured to output a pulse, for example a rising edge from the low to the high state, of the second comparison signal OUTH, when the output signal Van exceeds the second threshold value VREFH. The first and second comparison signal VREFL and VREFH of the comparator circuits 310 and 320 thus define start and stop points of T1 and T2 time periods from FIG. 2.

The time-to-digital converter/digital counter 330 is configured to determine a first timespan TS1 between the occurrence of the voltage jump/peak of the output signal Van to the level of the excess bias voltage Vex and the occurrence of the pulse of the first comparison signal OUTL. Furthermore, the time-to-digital converter/digital counter 330 is configured to determine a second timespan TS2 between the occurrence of the voltage jump/peak of the output signal Van and the occurrence of the pulse of the second comparison signal OUTH.

The calculation circuit 360 is configured to calculate the first and second time T1, T2 in dependence on the first and second timespan TS1, TS2. Moreover, the calculation circuit 360 is configured to determine the level of the excess bias voltage Vex in dependence on the first and the second time T1, T2 and in dependence on the first and second threshold value VREFL, VREFH. The level of the excess bias voltage Vex can be calculated from the calculation circuit 360 by evaluating the formula $$Vex = VREFL - \frac{T1 + T_{offset\_low}}{T2 + T_{offset\_high}}(VREFH - VREFL)$$

FIG. 5 shows a second embodiment of the electric circuit arrangement 1b to determine a level of the excess bias voltage Vex of the single photon avalanche diode 100.

The electric circuit arrangement 1b comprises the single photon avalanche diode 100, the controllable switching circuit 200 and the control circuit 400 being embodied as explained above with reference to FIGS. 1 and 3. The electric circuit arrangement 1b further comprises an evaluation circuit 300 to evaluate the output signal Van at the output terminal 40. The evaluation circuit 300 is configured to determine the level of the excess bias voltage Vex in dependence on the signal course of the output signal Van.

According to the embodiment of the electric circuit arrangement 1b, the evaluation circuit 300 comprises a comparator circuit 340 having a first input terminal I340a coupled to the output terminal 40, and a second input terminal I340b to apply the first and second threshold value VREFL, VREFH, and a comparator output terminal O340 to output a comparison signal OUT_COMP.

The evaluation circuit 300 further comprises a selection circuit 350 to select one of the first or second threshold value VREFL, VREFH to be applied to the second input terminal I340b of the comparator circuit 340. In particular, the selection circuit 350 comprises a control circuit 355 to generate a control signal to control a controllable switch 351 to apply the first threshold value VREFL to the second input terminal I340b of the comparator circuit 340. Furthermore, the control circuit 355 of the selection circuit 350 generates a control signal to control a controllable switch 352 to apply the second threshold value VREFH to the second input terminal I340b of the comparator circuit 340. The first threshold value VREFL is generated as a voltage level by a voltage source 353, and the second threshold value VREFH is generated as a voltage level by a voltage source 354.

The evaluation circuit 300 of the electric circuit arrangement 1b further comprises a time-to-digital converter/digital counter 330 being coupled to the comparator output terminal O340 and to the output terminal 40. Furthermore, the evaluation circuit 300 comprises a calculation circuit 360 being coupled to the time-to-digital converter/digital counter 330.

Figure 6:
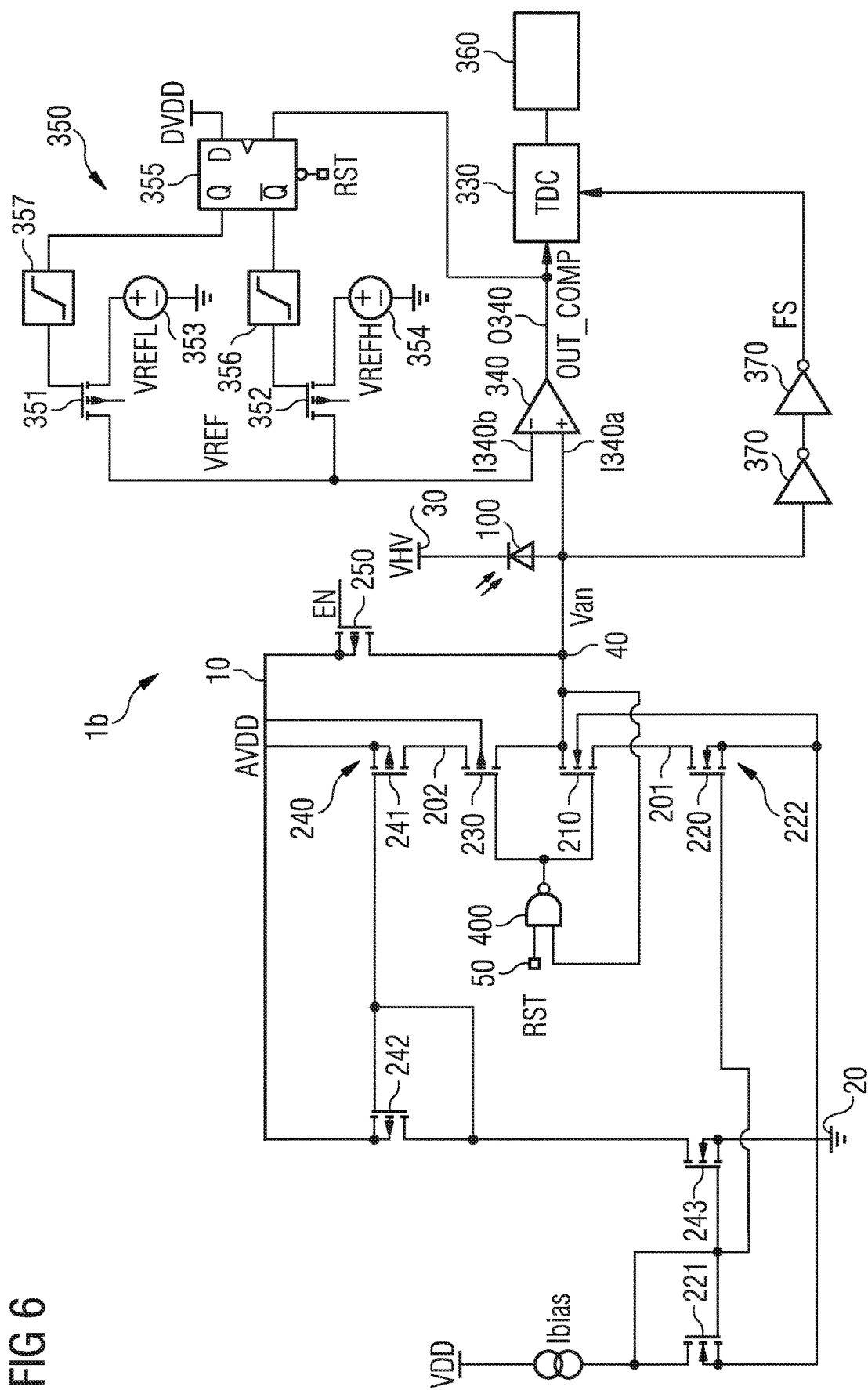
FIG. 6 shows a possible implementation of the second embodiment of the electric circuit arrangement to determine a level of an excess bias voltage of a SPAD.

FIG. 6 shows a possible implementation of the electric circuit arrangement 1b of FIG. 5. The electric circuit arrangement 1b of FIG. 6 comprises the single photon avalanche diode 100, the controllable switching circuit 200 and the control circuit 400 as explained with reference to FIG. 3.

The evaluation circuit 300 of the electric circuit arrangement 1b differs from the evaluation circuit of the electric circuit arrangement 1a shown in FIG. 3. In particular, the evaluation circuit 300 of the electric circuit arrangement 1b only comprises one comparator circuit 340 instead of the two comparator circuits 310, 320 of the evaluation circuit of the electric circuit arrangement 1a. The use of only one comparator circuit 340 has advantages regarding power consumption and measurement errors due to offset voltages and internal parasitics in comparison to the two comparator approach of FIG. 3.

As shown in FIG. 6, the control circuit 355 of the selection circuit 350 may be embodied as a flip-flop, for example a D-flip-flop. An input side of the flip-flop 355 is connected to the comparator output terminal O340 and to a terminal to apply a supply voltage DVDD. The supply voltage DVDD may be lower than the supply voltage AVDD. An output side of the control circuit 355 may be coupled via an optional level shifter 357 to a control terminal of the controllable switch 351 and via an optional level shifter 356 to a control terminal of the controllable switch 352.

The time-to-digital converter/digital counter 330 is coupled to the output terminal 40 via a feedback path including the in-series connected inverters 370.

The functioning of the electric circuit arrangement 1b shown in FIG. 6 is described in the following with reference to the time diagram of FIG. 7. The course of the control signal EN, the reset signal RST and the output signal Van is similar to the courses of the respective signals shown in, and described with reference to, FIG. 4. However, due to the different configuration of the evaluation circuit 300, the course of the comparison signal OUT_COMP generated by the comparator circuit 340 at the comparator output terminal O340 differs from the first and second comparison signals OUTL and OUTH of the first and second comparator circuits 310, 320 shown in FIG. 4.

The comparator circuit 340 is configured to output a first change of state/pulse of the comparison signal OUT_COMP at the comparator output terminal O340, when the output signal Van exceeds the first threshold value VREFL. Furthermore, the comparator circuit 340 is configured to output a second change of state/pulse of the comparison signal OUT_COMP at the comparator output terminal O340, when the output signal Van exceeds the second threshold value VREFH. FIG. 7 shows an exemplified course of the comparison signal OUT_COMP.

The time-to-digital converter/digital counter 330 may be configured to determine the first timespan TS1 between the occurrence of the voltage jump/peak of the output signal Van and the occurrence of the first change of state/pulse of the comparison signal OUT_COMP. Furthermore, the time-to-digital converter/digital counter 330 may be configured to determine the second timespan TS2 between the occurrence of the voltage jump/peak of the output signal Van and the occurrence of the second change of state/pulse of the comparison signal OUT_COMP.

The calculation circuit 360 may be configured to calculate the first and second time T1, T2 in dependence on the determined first and second timespan TS1, TS2. Furthermore, the calculation circuit 360 may be configured to determine the level of the excess bias voltage Vex in dependence on the first and second time T1, T2 and in dependence on the first and second threshold value VREFL and VREFH.

The embodiment of the electric circuit arrangement 1b shown in FIGS. 5 and 6 is believed to be an improved solution in comparison to the embodiment of the electric circuit arrangement 1a shown in FIGS. 1 and 3. The embodiment of the electric circuit arrangement 1a uses two comparator circuits 310 and 320 in comparison to the use of only one comparator circuit 340 of the electric circuit arrangement 1b. The two comparator circuits 310, 320 have different offset voltages and internal parasitics which introduce a measurement error by offset times. Also, the power consumption is doubled in the case of using two comparator circuits 310, 320 instead of only one comparator circuit 340. With the approach of the electric circuit arrangement 1b, the offset voltages and parasitics have less influence on measurement results. In comparison to the formula to calculate the level of the excess bias voltage Vex for the electric circuit arrangement 1a, the formula to calculate the level of the excess bias voltage Vex by the calculation circuit 360 of the electric circuit arrangement 1b is given by $$Vex = VREFL - \frac{T1 + T_{offset}}{T2 + T_{offset}}(VREFH - VREFL)$$

The formula which may be evaluated by the calculation circuit 360 shows that the measurement/calculation of the level of the excess bias voltage Vex is less influenced by the offset voltage and parasitics. For example, assuming T1=T2=10 μs and $T_{offset\_low}=-T_{offset\_high}=T_{offset}=0.1$ μs, the equations become, for the two comparator case of the electric circuit arrangement 1a:

$$\frac{T1 + T_{offset\_low}}{T2 + T_{offset\_high}} = \frac{10\ \mu s + 0.1\ \mu s}{10\ \mu s - 0.1\ \mu s} = \frac{10.1\ \mu s}{9.9\ \mu s} = 1.02$$

and for the one comparator case of the electric circuit arrangement 1b:

$$\frac{T1 + T_{offset}}{T2 + T_{offset}} = \frac{10\ \mu s + 0.1\ \mu s}{10\ \mu s + 0.1\ \mu s} = \frac{10.1\ \mu s}{10.1\ \mu s} = 1$$

The time $T_{offset}$ is a function of the bias conditions.

Figure 7:
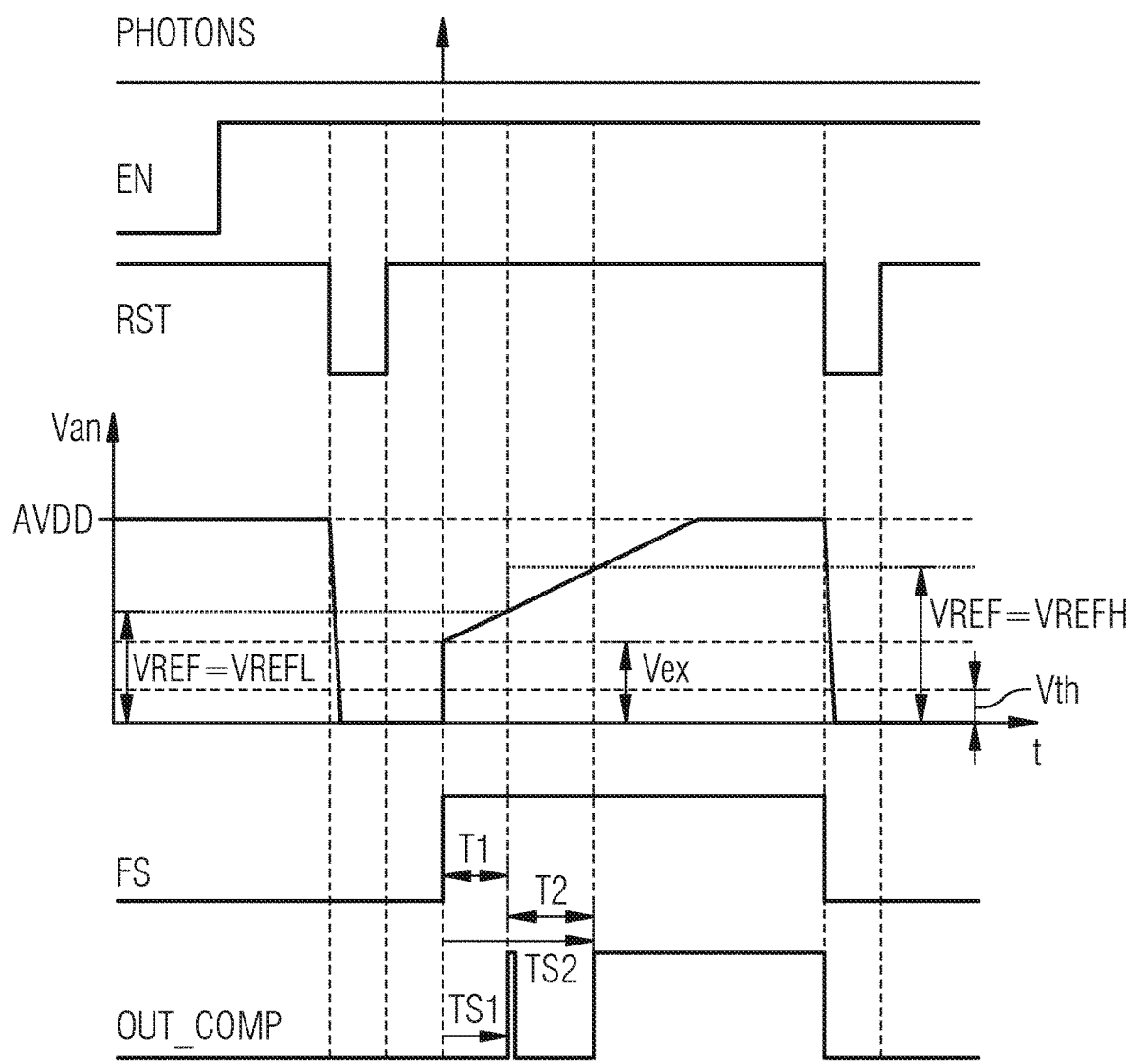
FIG. 7 illustrates a time diagram of signals at internal nodes of the implementation of the second embodiment of the electric circuit arrangement to determine a level of the excess bias voltage of the SPAD.

As shown in FIG. 7, after the reset phase (RST=0), the first threshold value VREFL is connected via the controllable switch 351, realized for example by a PMOS transistor, to the second comparator input terminal I340b, because the controllable switch 351 is operated in a conductive state. The controllable switch 352 that may also be realized by a PMOS transistor, is operated in a non-conductive state.

When the voltage slope of the output signal Van crosses the first threshold value VREFL, the comparison signal OUT_COMP has a change of state, for example a positive pulse, which is used by the calculation circuit 360 to determine the first time T1. The comparison signal OUT_COMP is also applied to the control circuit 355 and changes the state of the flip-flop 353 so that the controllable switch 351 is operated in a non-conductive state and the controllable switch 352 is operated in a conductive state. As a consequence, the second threshold value VREFH is forwarded to the second input terminal I340b of the comparator circuit 340.

Figure 8:
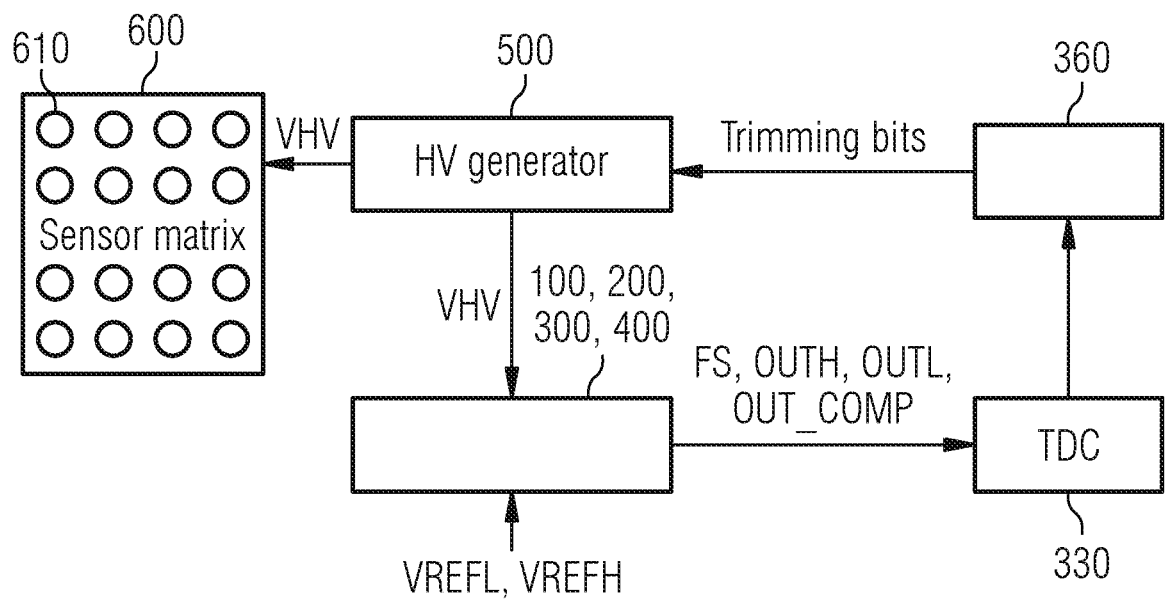
FIG. 8 shows an embodiment of a sensor device including an electric circuit arrangement to determine a level of an excess bias voltage of a SPAD.

FIG. 8 illustrates a possible application in which the electric circuit arrangement 1a, 1b to determine a level of an excess bias voltage Vex of a single photon avalanche diode may be used. The electric circuit arrangement 1a, 1b may be included in a sensor device 2. The sensor device 2 may comprise a bias voltage generator 500 to provide the bias potential VHV. The bias voltage generator 500 may be controlled by the calculation circuit 360 which may be embodied as a microprocessor.

In dependence on the calculated level of the excess bias voltage Vex a control signal, for example trimming bits, are generated by the calculation circuit 360 and received by the bias voltage generator 500. The bias voltage generator 500 may be configured to regulate the bias potential VHV in dependence on the level of the excess bias voltage Vex determined by the electric circuit arrangement 1a, 1b. The bias potential VHV may then be applied to the bias terminal 30 of the electric circuit arrangement 1a, 1b and to a sensor matrix 600 which may comprise optical sensors 610.

Figure 9:
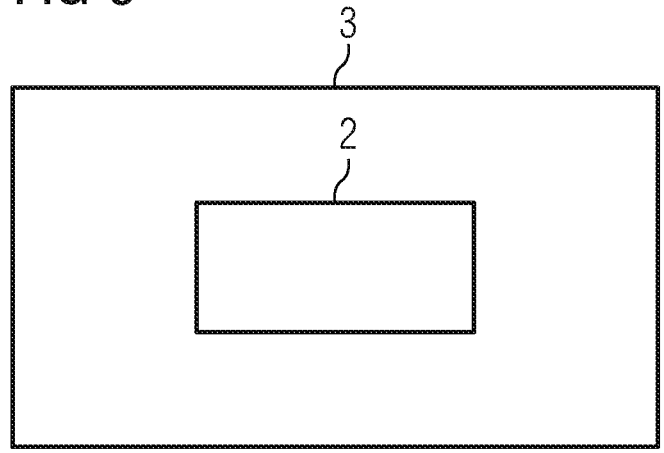
FIG. 9 shows an embodiment of a communication device comprising a sensor device including the electric circuit arrangement to determine a level of an excess bias voltage of a SPAD.

As shown in FIG. 9, the sensor device 2 may be included in a communication device 3. The communication device 3 may be embodied, for example, as one of a time-of-flight measurement device, a LIDAR measurement device, a time correlated single photon counting device, a tomograph, etc.

The single photon avalanche diode 100 is shown in the embodiments of the electric circuit arrangements 1a and 1b as being connected to the bias terminal 30 to apply a positive bias potential. Thus, the single photon avalanche diode 100 is connected with its cathode to the bias terminal 30 and with its anode to the output terminal 40. It is mentioned for the sake of completeness that a person skilled in the art can easily modify the electric circuit arrangements 1a, 1b to use a negative bias potential instead of a positive bias potential. In this case, the single photon avalanche diode 100 is connected with its anode side to the bias terminal 30 and with its cathode side to the output terminal 40. However, the basic principle of the electric circuit arrangements 1a and 1b stays unchanged.

The invention claimed is:

1. An electric circuit arrangement to determine a level of an excess bias voltage of a single photon avalanche diode, comprising:
   a supply terminal to apply a supply potential;
   a reference terminal to apply a reference potential;
   a bias terminal to apply a bias potential to bias the single photon avalanche diode;
   an output terminal to provide an output signal of the single photon avalanche diode, the single photon avalanche diode being connected between the bias terminal and the output terminal;
   a controllable switching circuit; and
   an evaluation circuit to evaluate the output signal, wherein the controllable switching circuit is configured to couple the output terminal to the reference terminal in a first operational cycle of the circuit arrangement so that a voltage jump to the level of the excess bias voltage occurs at the output terminal, when a photon hits a photosensitive area of the single photon avalanche diode, and to couple the output terminal to the supply terminal in a subsequent second operational cycle, wherein the single photon avalanche diode is quenched, when the voltage jump of the output signal to the level of the excess bias voltage is generated at the output terminal, so that a level of the output signal rises with a linear increasing slope, wherein the evaluation circuit is configured to determine a first time during which the output signal changes at the output terminal from the level of the excess bias voltage to a first threshold value, wherein the evaluation circuit is configured to determine a second time during which the output signal changes at the output terminal from the first threshold value to a second threshold value being different from the first threshold value, and wherein the evaluation circuit is configured to determine the level of the excess bias voltage in dependence on the first time and the second time and the first threshold value and the second threshold value.

2. The electric circuit arrangement of claim 1,
wherein the controllable switching circuit comprises a first current path being arranged between the output terminal and the reference terminal, and a second current path being arranged between the output terminal and the supply terminal,
wherein the first current path comprises a first controllable switch and a first current generator,
wherein the second current path comprises a second controllable switch and a second current generator.

3. The electric circuit arrangement of claim 1, comprising:
a control circuit to control the controllable switching circuit in dependence on a value of the output signal at the output terminal,
wherein the controllable switching circuit is configured to selectively electrically couple the output terminal to the supply terminal or the reference terminal in dependence on the value of the output signal at the output terminal.

4. The electric circuit arrangement of claim 3, comprising:
a reset terminal to apply a reset signal,
wherein the controllable switching circuit is configured to electrically couple the output terminal to the reference terminal, when the control circuit detects the application of the reset signal to the reset terminal.

5. The electric circuit arrangement of claim 3, wherein the control circuit is configured to control the controllable switching circuit so that, in the second operational cycle, the output terminal is electrically coupled by the controllable switching circuit to the supply terminal, when the output terminal is electrically coupled to the reference terminal in the first operational cycle and the control circuit detects the occurrence of the voltage jump of the output signal at the output terminal.

6. The electric circuit arrangement of claim 3, wherein the controllable switching circuit is configured such that the output signal changes at the output terminal from the level of the excess bias voltage to a value of the supply voltage, when the output terminal is electrically coupled to the supply terminal.

7. The electric circuit arrangement of claim 1,
wherein the evaluation circuit comprises a first comparator circuit having a first input terminal coupled to the output terminal, and a second input terminal to apply the first threshold value, and a first comparator output terminal to output a first comparison signal, the first comparator circuit being configured to output a pulse of the first comparison signal, when the output signal exceeds the first threshold value,
wherein the evaluation circuit comprises a second comparator circuit having a first input terminal coupled to the output terminal, and a second input terminal to apply the second threshold value, and a second comparator output terminal to output a second comparison signal, the second comparator circuit being configured to output a pulse of the second comparison signal, when the output signal exceeds the second threshold value.

8. The electric circuit arrangement of claim 7,
wherein the evaluation circuit comprises a time-to-digital converter or a counter being coupled to the first and second comparator output terminal and to the output terminal,
wherein the time-to-digital converter or the counter is configured to determine a first time span between the occurrence of the voltage jump of the output signal and the occurrence of the pulse of the first comparison signal,
wherein the time-to-digital converter or the counter is configured to determine a second time span between the occurrence of the voltage jump of the output signal and the occurrence of the pulse of the second comparison signal.

9. The electric circuit arrangement of 8, comprising:
wherein the evaluation circuit comprises a calculation circuit being coupled to the time-to-digital converter or the digital counter,
wherein the calculation circuit is configured to calculate the first and second time in dependence on the first and second time span,
wherein the calculation circuit is configured to determine the level of the excess bias voltage in dependence on the first and the second time and in dependence on the first and second threshold value.

10. The electric circuit arrangement of claim 1,
wherein the evaluation circuit comprises a comparator circuit having a first input terminal coupled to the output terminal, and a second input terminal to apply the first and second threshold value, and a comparator output terminal,
wherein the evaluation circuit comprises a selection circuit to select one of the first or second threshold value to be applied to the second input terminal of the comparator circuit,
wherein the comparator circuit is configured to output a first pulse of the comparison signal at the comparator output terminal, when the output signal exceeds the first threshold value, and to output a second pulse of the comparison signal at the comparator output terminal, when the output signal exceeds the second threshold value.

11. The electric circuit arrangement of claim 10,
wherein the evaluation circuit comprises a time-to-digital converter or a digital counter being coupled to the comparator output terminal and to the output terminal,
wherein the time-to-digital converter or the digital counter is configured to determine a first time span between the occurrence of the voltage jump of the output signal and the occurrence of the first pulse of the comparison signal,
wherein the time-to-digital converter is configured to determine a second time span between the occurrence of the voltage jump of the output signal and the occurrence of the second pulse of the comparison signal.

12. A sensor device, comprising:
an electric circuit arrangement to determine a level of an excess bias voltage of a single photon avalanche diode as claimed in claim 1,
a bias voltage generator to provide the bias potential, wherein the bias voltage generator is configured to regulate the bias potential in dependence on the level of the excess bias voltage determined by the electric circuit arrangement.

13. A communication device, comprising:
a sensor device as claimed in claim 12,
wherein the communication device is embodied as one of a time-of-flight measurement device, a LIDAR measurement device, a time correlated single photon counting device, or a tomograph.

* * * * *